United States Patent
Gamage et al.

(10) Patent No.: US 8,435,821 B2
(45) Date of Patent: May 7, 2013

(54) SENSOR AND METHOD FOR FABRICATING THE SAME

(75) Inventors: Sisira Kankanam Gamage, Palo Alto, CA (US); Naresh Venkata Mantravadi, San Jose, CA (US); Michael Klitzke, Nevada City, CA (US); Terry Lee Cookson, Hayward, CA (US)

(73) Assignee: General Electric Company, Schenectady, NY (US)

( * ) Notice: Subject to any disclaimer, the term of this patent is extended or adjusted under 35 U.S.C. 154(b) by 70 days.

(21) Appl. No.: 12/818,611

(22) Filed: Jun. 18, 2010

(65) Prior Publication Data

US 2011/0308324 A1 Dec. 22, 2011

(51) Int. Cl.
*H01L 21/00* (2006.01)

(52) U.S. Cl.
USPC ........................ 438/53; 438/456; 257/E21.536

(58) Field of Classification Search .................. 438/411; 257/E21.536
See application file for complete search history.

(56) References Cited

U.S. PATENT DOCUMENTS

| | | | |
|---|---|---|---|
| 4,274,423 A | 6/1981 | Mizuno et al. | |
| 4,785,822 A | 11/1988 | Wallace | |
| 4,975,390 A | 12/1990 | Fujii et al. | |
| 5,013,396 A | 5/1991 | Wise et al. | |
| 5,578,528 A * | 11/1996 | Wuu et al. | 216/2 |
| 6,038,928 A | 3/2000 | Maluf et al. | |
| 6,106,476 A | 8/2000 | Corl et al. | |
| 6,278,167 B1 | 8/2001 | Bever et al. | |
| 6,912,759 B2 | 7/2005 | Izadnegahdar et al. | |
| 6,959,608 B2 | 11/2005 | Bly et al. | |
| 8,127,618 B1 | 3/2012 | Zhao et al. | |
| 2003/0029245 A1 | 2/2003 | Izadnegahdar et al. | |
| 2004/0102021 A1 | 5/2004 | Sawyer et al. | |
| 2005/0172724 A1 | 8/2005 | Sakai et al. | |
| 2007/0052046 A1 * | 3/2007 | Chu et al. | 257/415 |

FOREIGN PATENT DOCUMENTS

| | | |
|---|---|---|
| EP | 1712515 A2 | 10/2006 |
| JP | 1253627 A | 10/1989 |
| JP | 4141139 A | 5/1992 |
| JP | 8075582 A | 3/1996 |
| JP | 2001304995 A | 10/2001 |
| WO | 0078667 A1 | 12/2000 |
| WO | 2009041465 A1 | 4/2009 |

OTHER PUBLICATIONS

Lee A. Christel, Kurt Petersen, Lucas NovaSensor, A Catheter Pressure Sensor With Side Vent Using Multiple Silicon Fusion Bonding, Dec. 30, 2002, 4 pages.

Search Report and Written Opinion from IE Application No. 2011/0281 dated Mar. 26, 2012.

Search Report from corresponding IE Application No. 2011/0282 dated Mar. 26, 2012.

* cited by examiner

*Primary Examiner* — Cheung Lee (74) *Attorney, Agent, or Firm* — Global Patent Operation; Mark A. Conklin (57) ABSTRACT

A sensor and method for fabricating a sensor is disclosed that in one embodiment bonds an etched semiconductor substrate wafer to an etched device wafer comprising a silicon on insulator wafer to create a suspended structure, the flexure of which is determined by an embedded sensing element to measure absolute pressure. Interconnect channels embedded in the sensor facilitate streamlined packaging of the device while accommodating interconnectivity with other devices.

10 Claims, 9 Drawing Sheets

SENSOR AND METHOD FOR FABRICATING THE SAME

BACKGROUND OF THE INVENTION

The subject matter herein relates generally to semiconductor microelectromechanical (MEMS) based sensor configurations that can be used to detect small forces or flexures generated from mechanical stress, chemo-mechanical stress, thermal stress, electromagnetic fields, and the like. More particularly, the subject matter disclosed herein relates to a MEMS based pressure sensor and a method for fabricating the same.

Advances in semiconductor microelectronic and MEMS based sensors have served greatly to reduce the size and cost of such sensors. The electrical and mechanical properties of silicon microsensors have been well chronicled. Silicon micromachining and semiconductor microelectronic technologies have blossomed into a vital sensor industry with numerous practical applications. For instance, micromachined silicon pressure sensors, acceleration sensors, flow sensors, humidity sensors, microphones, mechanical oscillators, optical and RF switches and attenuators, microvalves, ink jet print heads, atomic force microscopy tips and the like are widely known to have found their way into various applications in high volume medical, aerospace, industrial and automotive markets. The high strength, elasticity, and resilience of silicon makes it an ideal base material for resonant structures that may, for example, be useful for electronic frequency control or sensor structures. Even consumer items such as watches, scuba diving equipment and hand-held tire pressure gauges may incorporate silicon micromachined sensors.

The demand for silicon sensors in ever expanding fields of use continues to fuel a need for new and different silicon microsensor geometries and configurations optimized for particular environments and applications. Unfortunately, a drawback of traditional bulk silicon micromachining techniques has been that the contours and geometries of the resulting silicon microstructures have been significantly limited by the fabrication methods. For instance, etching silicon structures with conventional etching techniques is constrained, in part, by the crystal orientations of silicon substrates, which limits the geometry and miniaturization efforts of many desired structures.

The increasing use of microsensors to measure pressure has spurred the development of small silicon plate structures used, for example, as capacitors and to produce electrostatic forces. For instance, there exist microsensors that measure capacitance using an array of interdigitated polysilicon plates. Similarly, there exist microsensors that produce electrostatic forces using an array of layered plates. Further, there exist microsensors that measure the flexure, or bending, of silicon structures in response to forces such as pressure or acceleration.

Measurements of biological parameters using microsensors are becoming increasingly common and important for both diagnostic and patient monitoring purposes. In some applications, in-vivo catheter tip pressure sensors are used to measure either absolute pressure or differential pressure based on a given reference pressure, such as atmospheric pressure. For example, differential catheter tip pressure sensors can be used to measure the breathing of a human being based on pressure changes within the respiratory system with respect to atmospheric pressure. The expanding fields of use of microelectromechanical devices in general, and of catheter tip pressure sensors in particular, has created a demand for ever smaller devices. Unfortunately, there has been difficulty producing smaller devices that are also highly sensitive to small changes in pressure which can be effectively manufactured in high volumes.

Sensors manufactured through conventional fabrication techniques are limited with respect to their size and packaging. For example, the elongated nature of a catheter tip pressure sensor requires that electrical connections extend from one end of the sensor, typically the end that is not inserted, to the sensing portion of the device. These connections can detrimentally impact the size and shape of the resulting device. Additionally, because of the small size of the devices and the thin nature of the geometries used, conventional techniques for producing such micromechanical devices risk both breakage during the manufacturing process and potentially diminished reliability in the field. For example, since differential catheter tip pressure sensors measure pressure relative to a reference pressure, a vent from the sensor to an external reference pressure must be supplied. This is typically done through a fine capillary tube that is run to the catheter tip in parallel with the electrical connections along the back of the chip. However, this configuration can result in thicker packaging of the sensor and can result in the vent becoming pinched-off during measurement. Other fabrication techniques employ side vent configurations that exit the chip through vent ports located on one of the chip edges, but which require additional processing steps to create the vent port, such as sawing, that can result in entry of debris into the vent port and diminish both accuracy and reliability.

It would be advantageous to provide a method for manufacturing highly sensitive pressure sensors that are not only small in size, but which can be effectively produced in high volume.

BRIEF DESCRIPTION OF THE INVENTION

A sensor and a method for fabricating a sensor is disclosed, in one embodiment comprising a diaphragm cavity that extends into the top surface of a substrate wafer, a device layer, wherein the bottom surface of the device layer is bonded to the top surface of the substrate wafer to form a diaphragm over the diaphragm cavity, a sensing element in the device layer proximate the diaphragm to sense flexure in the diaphragm, and an interconnect channel.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of invention. Thus, for further understanding of the invention, reference can be made to the following detailed description, read in connection with the drawings in which.

DETAILED DESCRIPTION OF THE INVENTION

An exemplary micromachined pressure sensor can be made by forming a cavity within a silicon structure and a diaphragm adjacent to the cavity. In differential pressure sensor embodiments, the cavity is connected to a vent that provides access to the cavity from outside the sensor, either through the side, bottom, or combination side and bottom of the sensor. For an absolute pressure sensor, in which measurements are made in relation to a selected reference pressure, the cavity can be held in a vacuum or a selected internal pressure. The pressure sensor measures pressure by sensing the flexure of the diaphragm, for example how the pressure acting on the front side of the diaphragm deflects the diaphragm inwards. One or more sensing elements formed near the edges of the diaphragm typically sense the flexure or deflection of the diaphragm.

Figure 1:
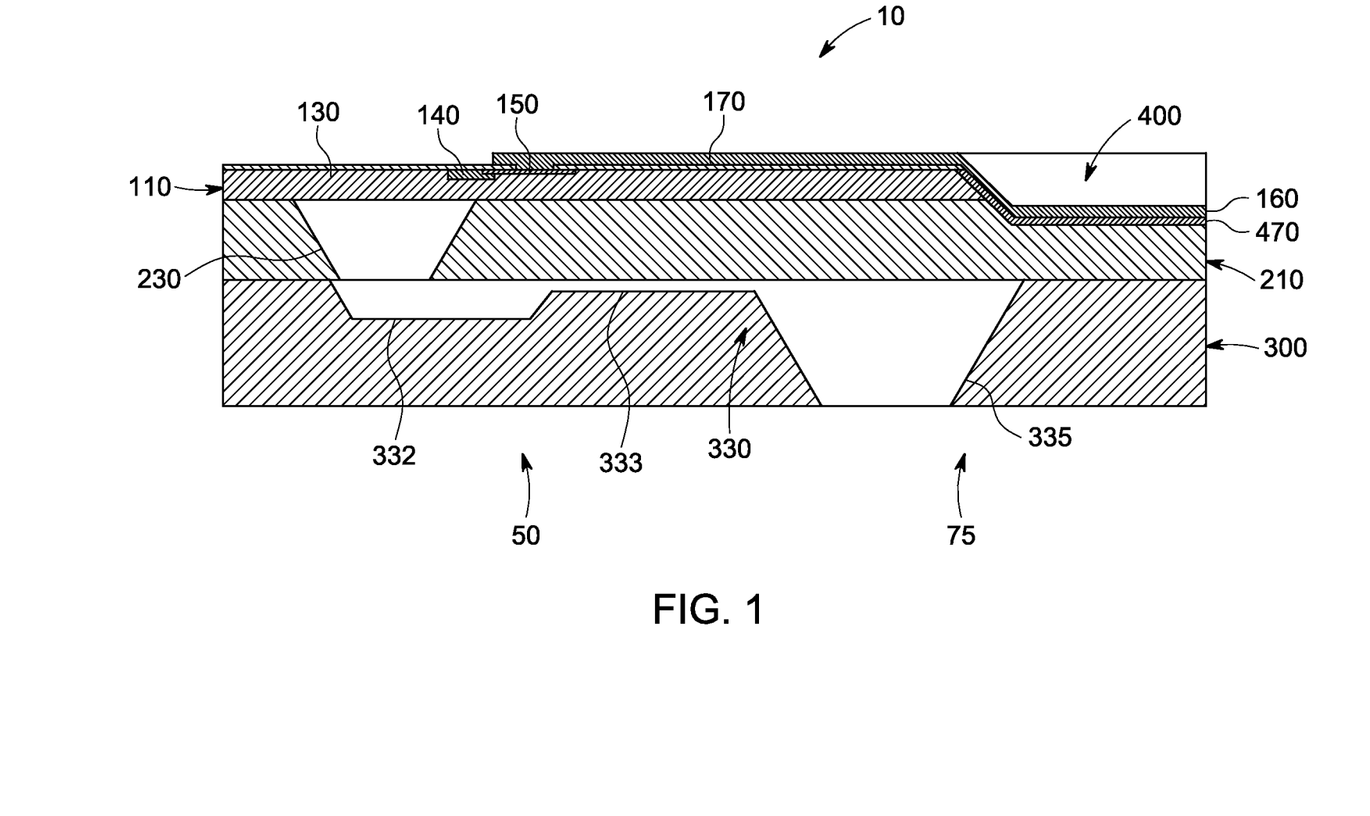
FIG. 1 is a cross sectional view of an exemplary differential pressure sensor in one embodiment of the invention.

FIG. 1 is an exemplary cross sectional view of a differential pressure sensor 10 having a bottom vent cavity 330 in one embodiment of the invention. Pressure sensor 10 can have a distal end 50 containing the pressure sensing elements of the device that, in one embodiment, comprise the tip of the catheter that can be insertable into a medium, for example a patient's respiratory system, for taking pressure measurements. Pressure sensor 10 can also have a proximal end 75 that can be capable of electrically coupling with other devices for reading and processing the pressure measurements.

Figure 2:
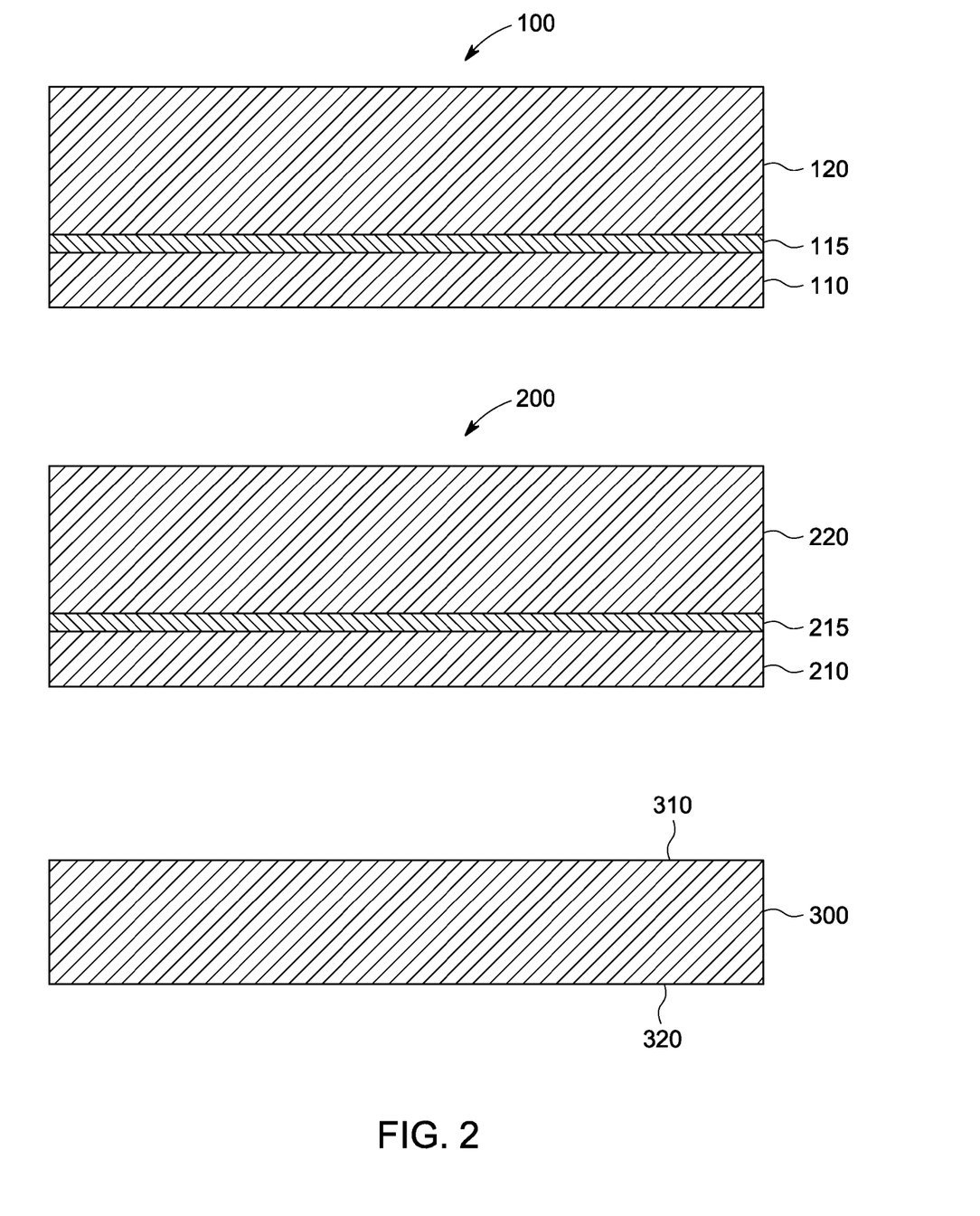
FIG. 2 is a cross sectional view of two exemplary silicon on insulator device wafers and an exemplary substrate wafer used to fabricate a differential pressure sensor in one embodiment of the invention.

Pressure sensor 10 can be manufactured using three wafers that are processed and bonded together, for example two silicon on insulator (SOI) semiconductor wafers and a double side polished (DSP) semiconductor wafer, or three SOI wafers. FIG. 2 shows three exemplary starting wafers in one embodiment of the invention. Device wafers 100 and 200 can be SOI wafers having device layers 110 and 210, insulator layers 115 and 215, and handle layers 120 and 220, respectively. Device layer 110 can be a single crystal silicon substrate which, in one embodiment, can be 1 to 10 μm thick and have n-type doping. Device layer 210 can be a single crystal silicon substrate which, in one embodiment, can be a thickness selected to meet particular design specifications, and which can have n-type or p-type doping. The thickness of the various layers of the SOI wafer can be precisely set using conventional SOI chip manufacturing techniques, and can be selected such that the precise thickness of the layers determine the subsequent operating characteristics of the pressure sensor 10, as will be described below. Insulator layers 115 and 215 can, in one embodiment, be silicon dioxide and range between 0.05 μm to 1.0 μm thick. Handle layers 120 and 220 can be used to grip the device wafers 100 and 200, respectively, during the manufacturing process, and can be located such that the insulator layers 115 and 215 are positioned between the device layers 110 and 210 and the handle layers 120 and 220, respectively. Handle layers 120 and 220 can consist of, for example, n-type or p-type silicon having a thickness between 200 μm to 600 μm. In one embodiment, substrate wafer 300 can be a double side polished silicon wafer which, in one embodiment, can be 300 μm to 600 μm thick and have n-type or p-type doping. In other embodiments, substrate wafer 300 can be a third SOI wafer. Together, the thicknesses of the various layers comprising the pressure sensor 10 can be selected such that the overall thickness of the device in one embodiment can be 390 μm or less.

With reference again to FIG. 1, pressure sensor 10 can be comprised of device layer 110, device layer 210 and substrate wafer 300. One or more sensing elements 140, for example p-type piezoresistive sensing elements, can be strategically implanted or diffused within the device layer 110 to sense flexure in the silicon structures. Pressure sensor 10 can also include passivation layers 170 and 470 that can consist of, for example, a silicon dioxide layer, a silicon nitride layer, or a combination of both. Passivation layers 170 and 470 can provide insulation and protection to pressure sensor 10 during manufacturing and operation. One or more interconnects 150 formed on device layer 110 can electrically couple one or more sensing elements 140 to the exterior of the pressure sensor 10, while one or more metallization layers 160 can provide electrical connectivity between the interconnects 150 and the proximal end 75 of the pressure sensor 10 such that the pressure sensor can be electrically coupled to other devices or connections through, for example, a lead attachment.

Figure 3:
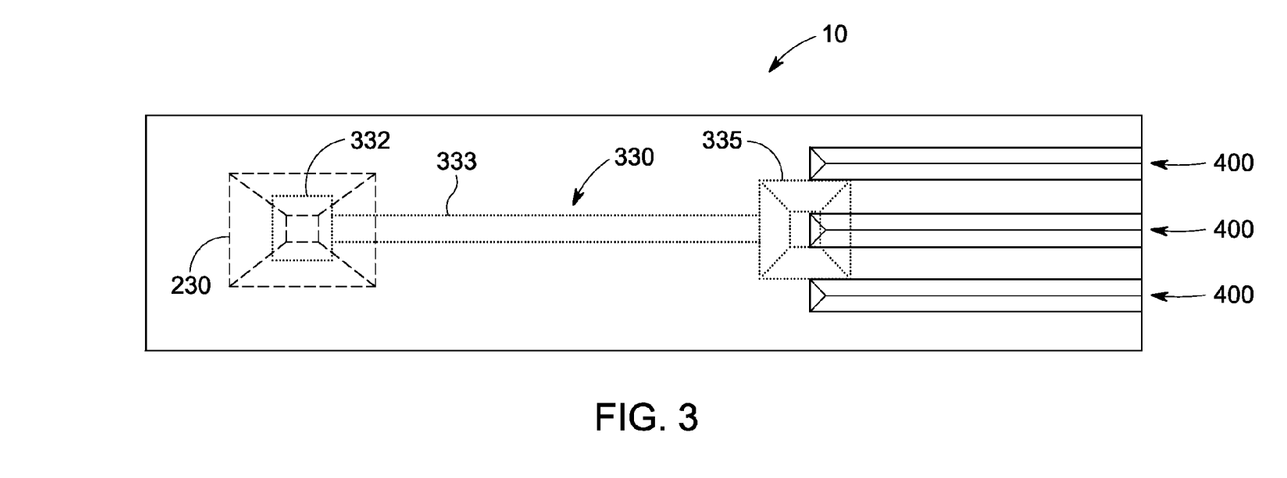
FIG. 3 is an exemplary top view of a differential pressure sensor illustrating an embedded vent in one embodiment of the invention.

With reference to FIGS. 1 and 3, an exemplary differential pressure sensor 10 and operation thereof is described in one embodiment of the invention. FIG. 3 is an exemplary top view of a differential pressure sensor 10 illustrating an embedded vent cavity 330 in one embodiment of the invention. Dotted lines in FIG. 3 depict exemplary embedded structures within the pressure sensor 10 that form the vent 330, while dashed lines in FIG. 3 depict an exemplary diaphragm cavity 230 embedded within pressure sensor 10. Pressure sensor 10 operates by measuring flexure in a thinned structure or diaphragm 130 formed in device layer 110 over a diaphragm cavity 230 formed in device layer 210, which is bonded between substrate wafer 300 and device wafer 110. The diaphragm serves as a flexure structure in pressure sensor 10. Vent cavity 330 connects diaphragm cavity 230 to the exterior of pressure sensor 10 through a hollow vent channel 333 beginning at a vent recess 332 connected to the diaphragm cavity 230 and extending through the substrate wafer 300 to a vent outlet 335 that opens to the exterior. As the pressure above the diaphragm 130 changes, the diaphragm 130 will flex towards or away from the diaphragm cavity 230 in relation to the pressure at the vent outlet 335. The elongated structure of the pressure sensor 10 can allow the pressure sensor 10 to operate as a catheter tip pressure sensor such that the portion of the pressure sensor 10 comprising the diaphragm 130 can be inserted into a medium, for example a patient's respiratory system or bloodstream, while the vent outlet 335 remains exposed to an exterior pressure gradient, for example atmospheric pressure, thereby providing differential pressure measurement.

Diaphragm 130 will flex in relation to the diaphragm cavity 230 in a predictable way from pressure exerted on the diaphragm 130. The flexure in diaphragm 130 can be detected by one or more sensing elements 140 formed in device layer 110 on or near the edges of diaphragm 130. In one embodiment using piezoresistive sensing elements, the resistance of sensing element 140 can be determined via a circuit, such as a wheatstone bridge circuit or the like, interconnected using one or more interconnects 150 attached to one or more metallization layers 160 that can extend from the interconnects 150 through interconnect channels 400 formed in device layer 110, or both device layers 110 and 210, to the proximal end 75 of the pressure sensor 10. An electrical interface or other such device can be attached to the ends of the metallization layers 160 to place the pressure sensor 10 in electrical communication with another device. The resistance of the piezoresistive sensing element varies with the flexure of diaphragm 130. Thus, measurement of the piezoresistive resistance of sensing element 140 can be used to determine the amount of flexure in diaphragm 130, and thereby determine the pressure exerted on the sensor.

Figure 9:
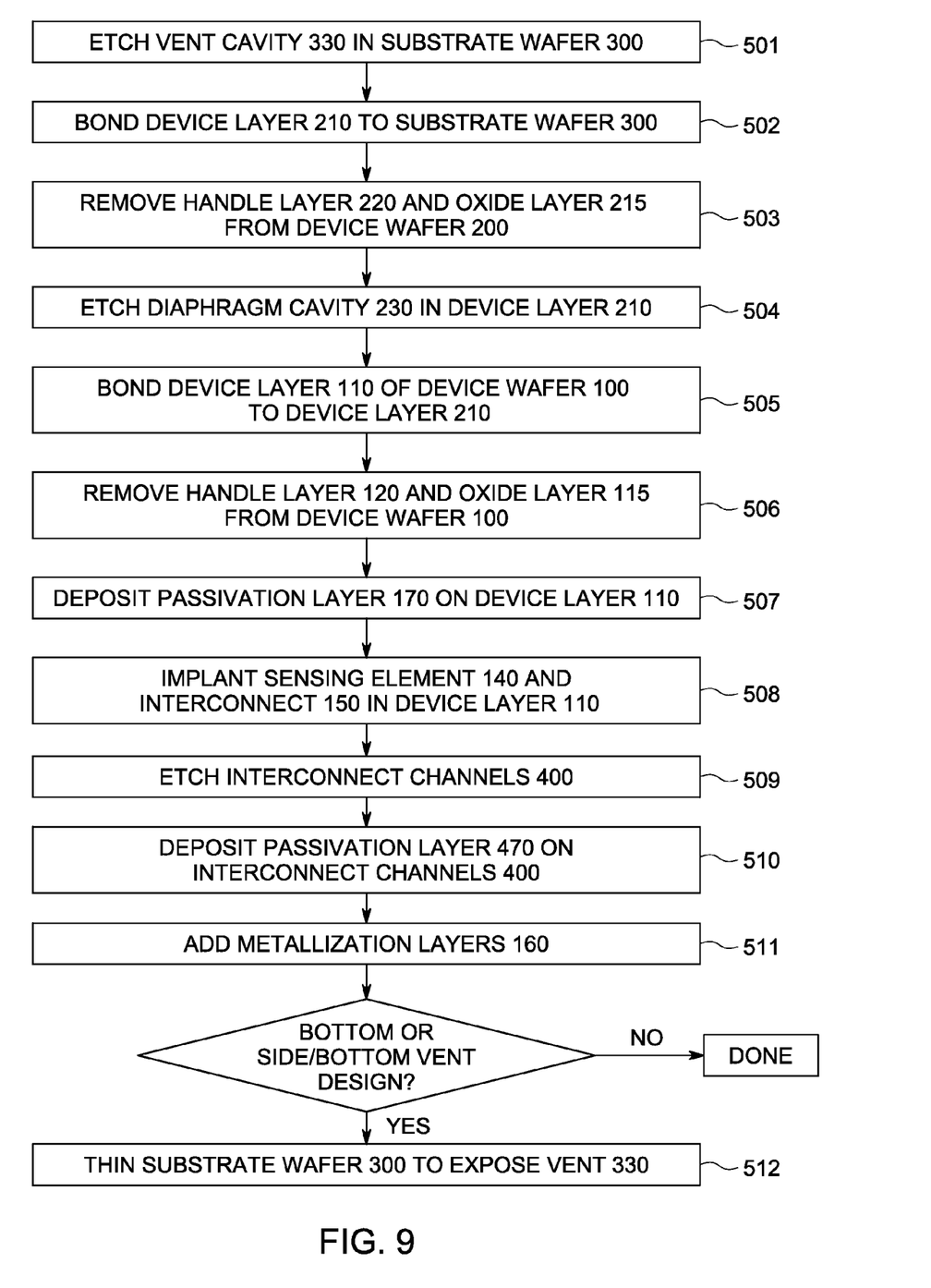
FIG. 9 is an exemplary process flow for fabricating a differential pressure sensor in one embodiment of the invention.

An exemplary process for fabricating a silicon sensor like the one illustrated in FIG. 1 is explained with reference to FIGS. 1 through 10. FIG. 9 is an exemplary process flow for fabricating a differential pressure sensor 10 in one embodiment of the invention. In step 501 of FIG. 9, vent recess 332, vent channel 333 and vent outlet 335, which together can form the vent cavity 330 in pressure sensor 10, can be formed on an upper substrate surface 310 of substrate wafer 300 using standard semiconductor etch techniques such as dry etching using deep reactive ion etching (DRIE), wet etching with potassium hydroxide (KOH) or tetramethylammonium hydroxide (TMAH), or other silicon etchants or the like. In one embodiment, a first etch is made to form the vent recess 332 and vent channel 333, followed by a second etch to form the vent outlet 335.

Figure 5:
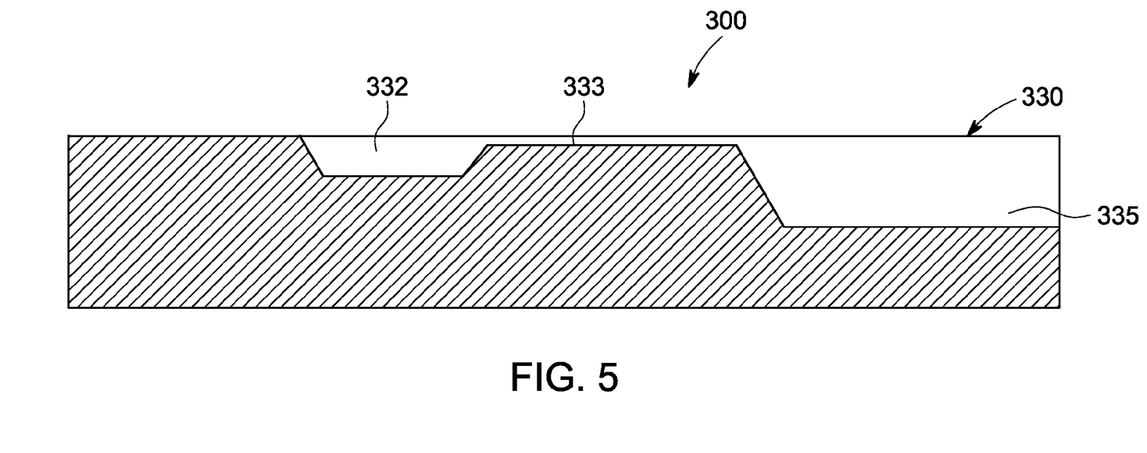
FIG. 5 is an exemplary substrate wafer with etched side vent in one embodiment of the invention.
Figure 6:
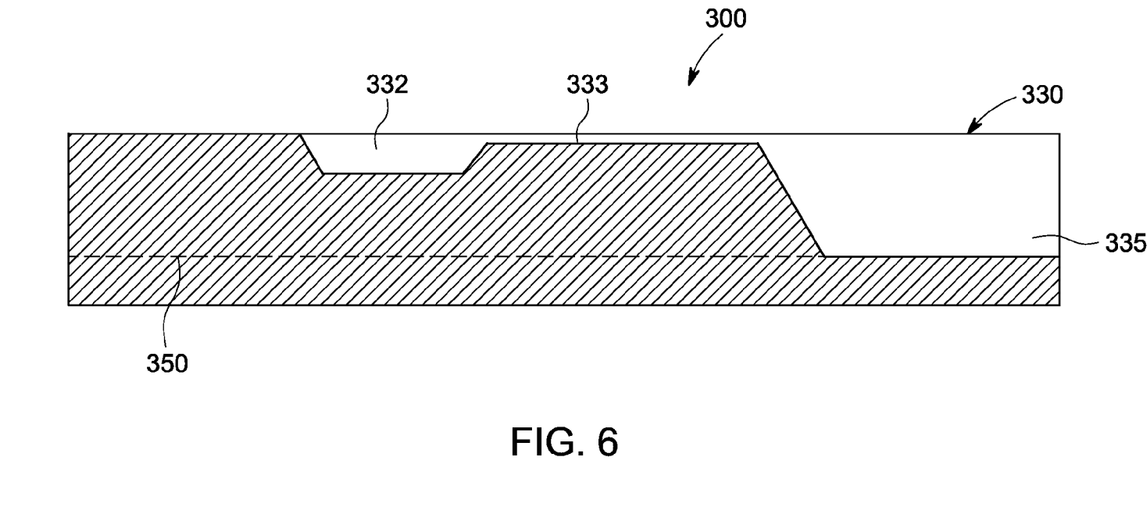
FIG. 6 is an exemplary substrate wafer with etched side and bottom vent in one embodiment of the invention.
Figure 7:
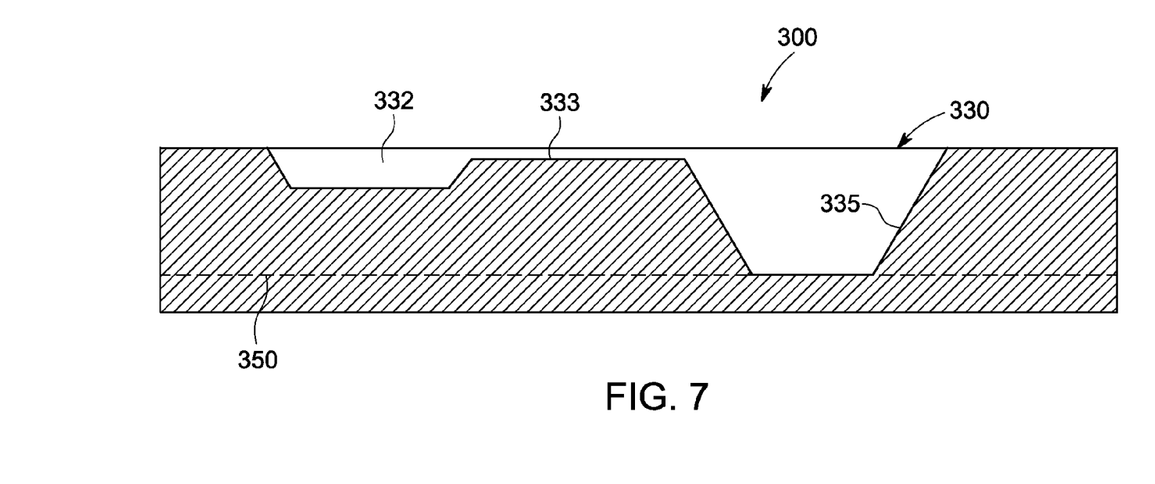
FIG. 7 is an exemplary substrate wafer with etched bottom vent in one embodiment of the invention.

As shown in FIGS. 5 through 7, different etch geometries can be employed to form recesses on the upper substrate surface 310 of substrate wafer 300 to achieve different vent cavity configurations. In one embodiment, shown in FIG. 5, vent cavity 330 can be a side vent configuration in which vent outlet 335 forms an opening on a side of the substrate wafer 330. In other embodiments having a bottom or a combination side/bottom vent cavity 330 configuration, later fabrication steps can include thinning the substrate wafer 300 to expose the vent outlet 335 to the exterior of the differential pressure sensor 10. For example, in bottom vent and side/bottom vent embodiments, the bottom substrate surface 320 of substrate wafer 300 can be removed up to the thickness indicator 350 shown in FIGS. 6 and 7. In the embodiment shown in FIG. 6, when the bottom substrate surface 320 of substrate wafer 300 is thinned to the thickness indicator 350 a side/bottom vent cavity 330 with opening on both the side and bottom of substrate wafer 330 is formed. In another embodiment, shown in FIG. 7, when the bottom substrate surface 320 of substrate wafer 300 is thinned to the thickness indicator 350 a bottom vent with an opening on the bottom substrate surface 320 of substrate wafer 300 is formed.

Figure 4:
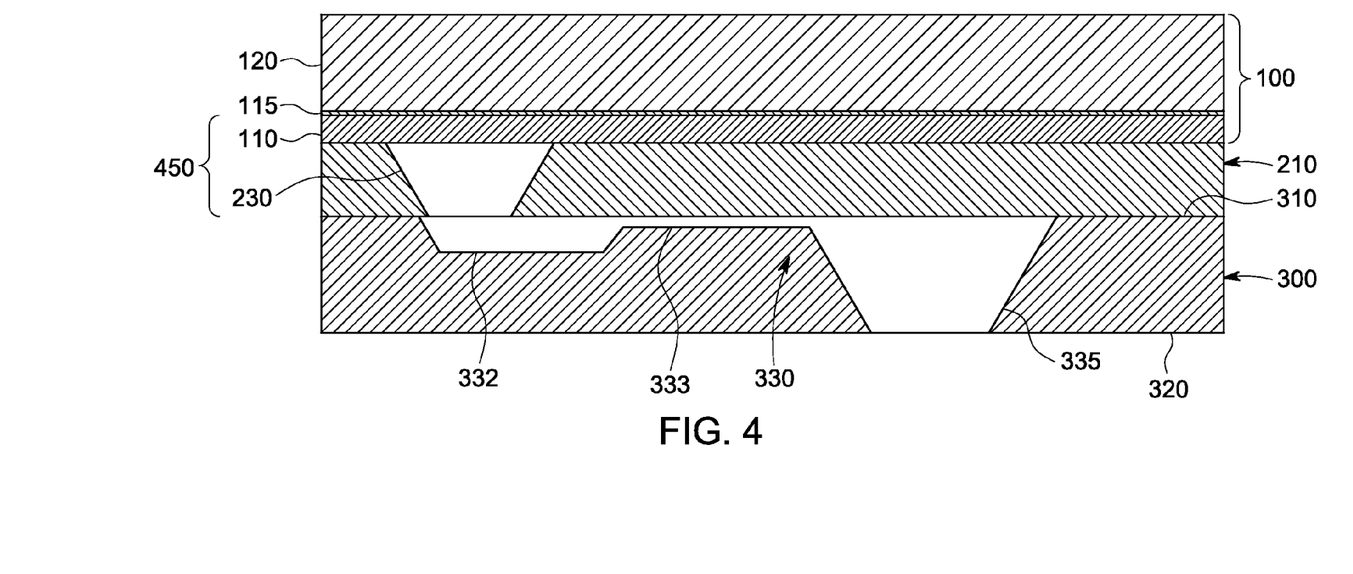
FIG. 4 is an exemplary substrate wafer with vent bonded to a first device layer with diaphragm cavity bonded to a second device wafer in one embodiment of the invention.

FIG. 4 is an exemplary substrate wafer 300 with vent cavity 330 bonded to a first device layer 210 with diaphragm cavity 230 bonded to a second device wafer 100 in one embodiment of the invention. With reference to FIGS. 4 and 9, step 502 in the fabrication process can be to bond the device layer 210 of device wafer 200 to the upper substrate surface 310 of the substrate wafer 300 using conventional silicon fusion bonding techniques. In one exemplary fusion bonding technique, the opposing surfaces can be made hydrophilic. That is, the surfaces can be treated with a strong oxidizing agent that causes water to adhere to them. The two wafers can then be placed in a high temperature environment for a period of time demanded by the quality of the bond. This silicon fusion bonding technique bonds the substrate wafer 300 and the device wafer 200 together without the use of an intermediate adhesive material that could have a different coefficient of thermal expansion than the single crystal silicon wafer. Fusion bonding can also be performed in which oxide layers are formed on the bonded surfaces of one or both of the wafers.

In step 503, after the upper substrate surface 310 of the substrate wafer 300 and device layer 210 have been bonded, the handle layer 220 of the device wafer 200 can be removed using a wet etchant, such as KOH or TMAH, that stops on the insulator layer 215. Additionally, insulator layer 215 can be removed using wet or dry etching techniques, leaving only the bonded device layer 210, which is now exposed.

In step 504, the diaphragm cavity 230, which can be a hole extending through the device layer 210, can be etched into device layer 210 using DRIE, wet etching with KOH or TMAH, or other silicon etchants or the like. Diaphragm cavity 230 can have various geometries, for example square, rectangle or circular, and can have any required depth, for example, from less than 5 microns to greater than 100 microns, depending on the particular application and the chosen thickness of device layer 210. The surfaces of diaphragm cavity 230 and vent cavity 330 can be either bare silicon, oxidized silicon, doped silicon, or they can be coated with any other thin film capable of withstanding subsequent wafer bonding and processing temperatures.

In step 505, device layer 110 of device wafer 100 can be bonded to the device layer 210 of device wafer 200 using conventional silicon fusion bonding techniques to form a device pair 450. In one exemplary fusion bonding technique, the opposing surfaces can be made hydrophilic. That is, the surfaces can be treated with a strong oxidizing agent that causes water to adhere to them. The two wafers can then be placed in a high temperature environment for a period of time demanded by the quality of the bond. This silicon fusion bonding technique bonds device wafer 100 and device wafer 200 together without the use of an intermediate adhesive material that could have a different coefficient of thermal expansion than the single crystal silicon wafer. Fusion bonding can also be performed in which oxide layers are formed in the bonded surfaces of one or both of the wafers.

In step 506, after the opposing surfaces of the device layer 210 and device 110 have been bonded, the handle layer 120 of the device wafer 100 can be removed using a wet etchant, such as KOH or TMAH, that stops on the insulator layer 115. Additionally, insulator layer 115 can be removed using wet or dry etching techniques, leaving the non-bonded device layer 110 exposed.

Figure 8:
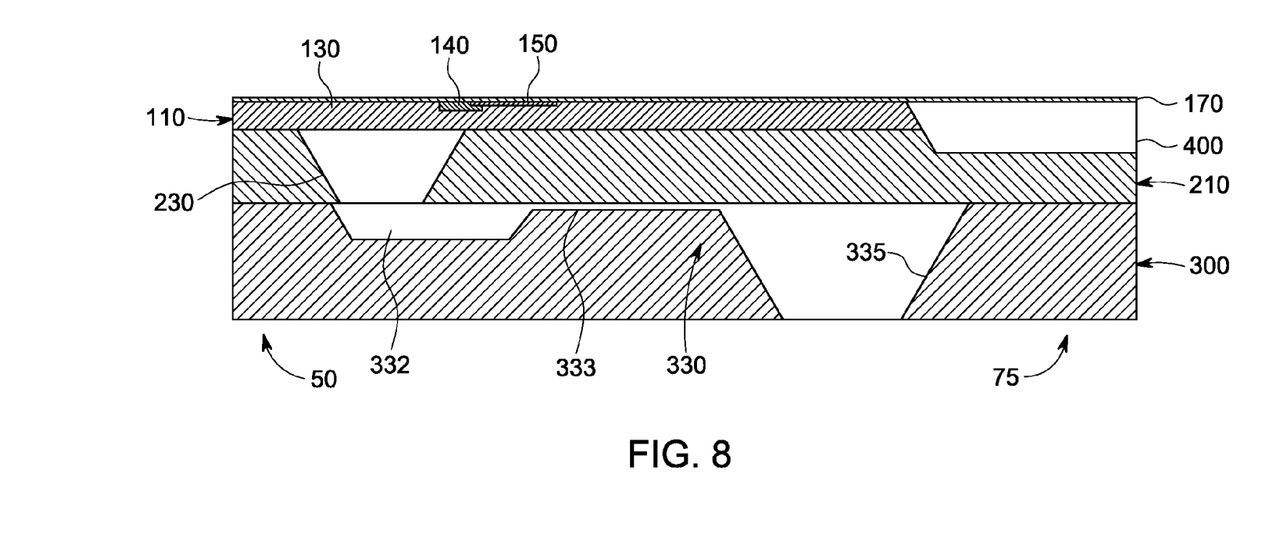
FIG. 8 is an exemplary substrate wafer with vent bonded to a first device layer with diaphragm cavity bonded to a second device layer having an interconnect channel, sensing element and interconnect in one embodiment of the invention.

FIG. 8 is an exemplary substrate wafer 300 with vent cavity 330 bonded to a first device layer 210 with diaphragm cavity 230 bonded to a second device layer 110 having an interconnection channel 400, sensing element 140 and interconnect 150 in one embodiment of the invention. With reference to FIGS. 8 and 9, in step 507, passivation layer 170 can be deposited on the non-bonded surface of device layer 110 using, for example, a silicon dioxide layer, a silicon nitride layer, or combinations of both to properly insulate and protect the device wafer 110 during both the manufacturing process and operation. In step 508, one or more sensing elements 140 can be added by diffusion or ion implanting of, in one preferred embodiment using piezoresistive sensing elements, low doped p-type material into the doped n-type device layer 110 near the edges of diaphragm 130, which can be formed as part of the device layer 110. For example, Boron implantation and diffusion at high temperature may form one or more piezoresistive sensing elements within device layer 110. The piezoresistive sensing elements can be positioned to sense flexure in diaphragm 130. It should be noted that any number of piezoresistive sensing elements may be employed and their exact positioning relative to the diaphragm 130 may be different depending on the particular application, expected pressures, sensitivity requirements, and the like. Additionally, one or more interconnects 150 that can provide electrical conductivity to the sensing elements 140 can be added by diffusion or ion implanting of highly doped p-type material into the doped n-type device layer 110 overlapping sensing elements 140. Diffusion or implantation of sensing element 140 and interconnect 150 can be done in individual steps or in a single step.

In step 509, one or more interconnect channels 400 that provide a passageway along the pressure sensor 10 for conductors can be etched, in one embodiment, into device layers 110 and 210. As shown in FIG. 8, passivation layer 170 can be etched using dry or wet etching techniques to define the location of the interconnect channels 400 on the proximal end 75 of the pressure sensor 10. Once the passivation layer 170 has been removed, one or more interconnect channels 400 can be etched into device layer 110, and optionally device layer 210, through wet etching techniques, for example using KOH or TMAH. In one embodiment, interconnect channels 400 are etched to form a series of spaced apart v-shaped grooves, as shown in an exemplary cross section of the proximal end 75 of the pressure sensor 10 shown in FIG. 10. Interconnect channels 400 can facilitate the later attachment of one or more conductors to the proximal end 75 of pressure sensor 10 while maintaining the small, elongated packaging required for some applications, such as catheter tip pressure sensors.

Figure 10:
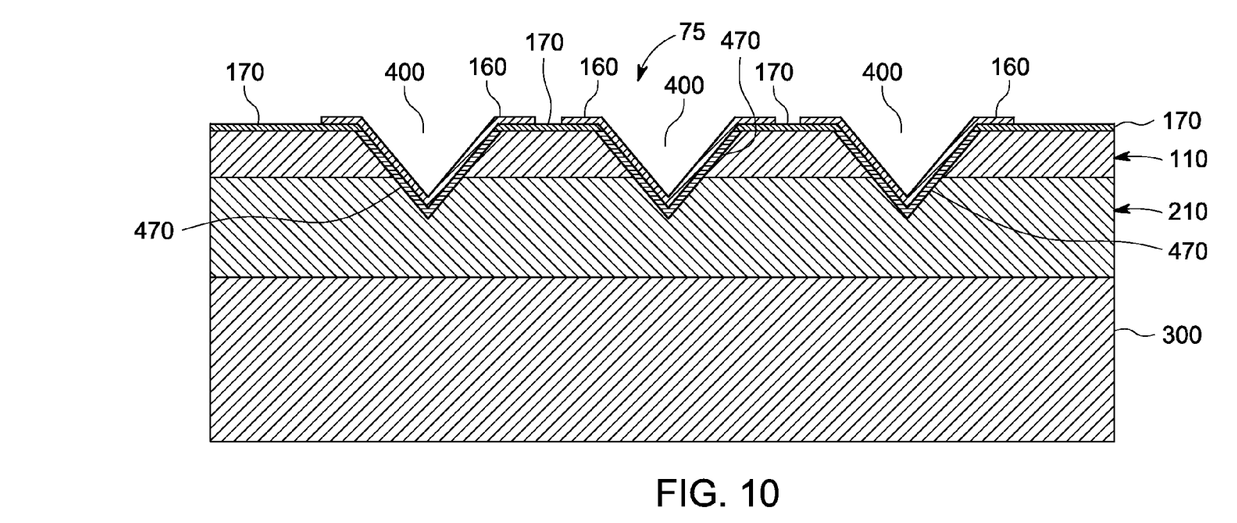
FIG. 10 is an exemplary cross sectional view of a proximal side of a differential pressure sensor in one embodiment of the invention.

With reference to FIGS. 9 and 10, in step 510 passivation layer 470 can be deposited on the surface of interconnect channels 400 using, for example, a silicon dioxide layer, a silicon nitride layer, or a combination of both to properly insulate and protect the interconnect channels 400 during both the manufacturing process and operation. Additionally, passivation layer 170 can be etched using dry or wet etching techniques to access interconnect 150. In step 511, metallization layer 160 can be added, providing electrical conductivity from the proximal end 75 of pressure sensor 10 to the sensing elements 140 through interconnects 150. Metallization layer 160 can be formed of, for example, gold or aluminum, and can be created to a desired thickness to suit device design needs.

In embodiments, in which substrate wafer 300 is an SOI wafer, the handle layer of the substrate wafer 300 can be removed using a wet etchant, such as KOH or TMAH, that stops on the insulator layer. Additionally, the insulator layer can be removed using wet or dry etching techniques, leaving only the device layer of the SOI wafer containing the vent 300 bonded to the device layer 210.

Lastly, if the pressure sensor 10 is a bottom or side/bottom vent embodiment, in step 512 the substrate wafer 300 can be thinned down using dry etching or wet etching techniques, for example using KOH or TMAH, to expose the vent outlet 335 on the exterior of the pressure sensor 10.

Figure 11:
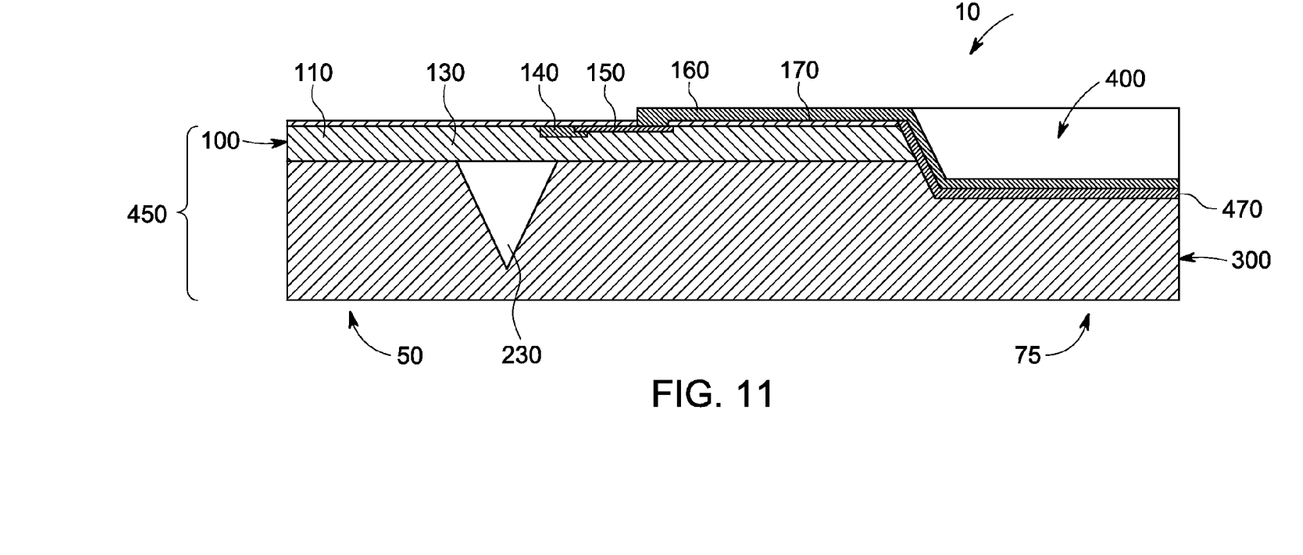
FIG. 11 is an exemplary absolute pressure sensor in one embodiment of the invention.
Figure 12:
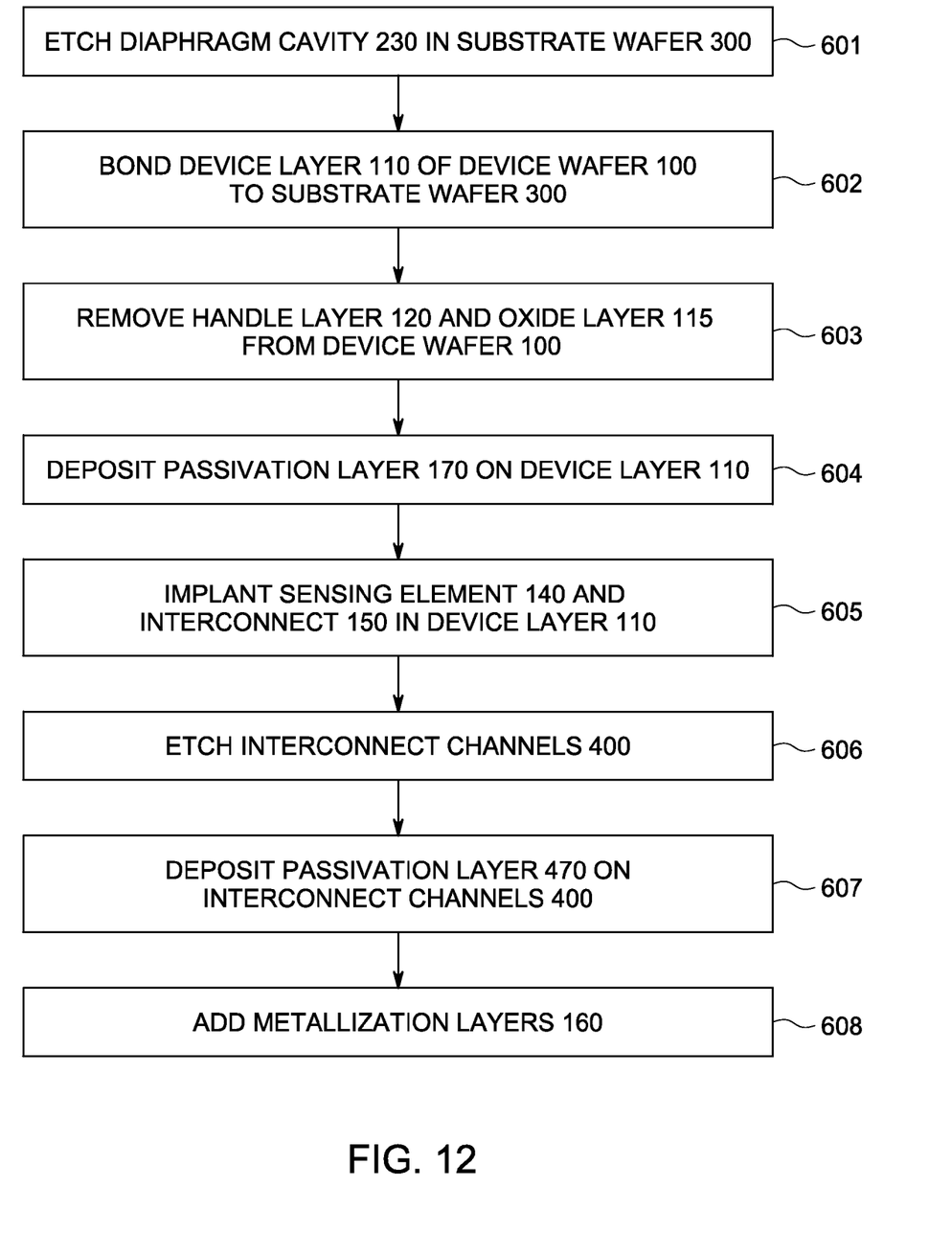
FIG. 12 is an exemplary process flow for fabricating an absolute pressure sensor in one embodiment of the invention.

FIG. 11 shows one exemplary embodiment in which pressure sensor 10 can be fabricated such that a vacuum, or other selected pressure, is formed within the diaphragm cavity 230 so that pressure sensor 10 is an absolute pressure sensor. In this embodiment, pressure measurements are not taken in relation to the exterior pressure of the sensor, so that fabrication of a vent within the sensor is unnecessary. FIG. 12 is an exemplary process flow showing the steps that can be performed to fabricate an absolute pressure sensor 10 in one embodiment of the invention. The techniques employed are similar to those in fabricating a differential pressure sensor, but because this embodiment does not require a vent, the pressure sensor 10 can be fabricated using only two wafers and, accordingly, some fabrications steps can be eliminated. In one embodiment, the absolute pressure sensor 10 can comprise an SOI device wafer 100 and a DSP substrate wafer 300. In another embodiment, absolute pressure sensor 10 can comprise a first SOI device wafer 100 and the substrate wafer 300 can comprise a second SOI device wafer.

With reference to FIGS. 11 and 12, in step 601, the diaphragm cavity 230 can be etched directly into the substrate wafer 300 using DRIE, wet etching with KOH or TMAH, or other silicon etchants or the like. Diaphragm cavity 230 can have various geometries, for example square, rectangular or circular, and can have any required depth, for example, from less than 5 microns to greater than 100 microns, depending on the particular application and the chosen thickness of the substrate wafer 300. The surface of diaphragm cavity 230 can be either bare silicon, oxidized silicon, doped silicon, or it can be coated with any other thin film capable of withstanding subsequent wafer bonding and processing temperatures.

In step 602, the device layer 110 of device wafer 100 is bonded to the surface of the substrate wafer 300 using conventional silicon fusion bonding techniques to form a device pair 450. In one exemplary fusion bonding technique, the opposing surfaces can be made hydrophilic. That is, the surfaces can be treated with a strong oxidizing agent that causes water to adhere to them. The two wafers can then be placed in a high temperature environment for a period of time demanded by the quality of the bond. The silicon fusion bonding technique described above bonds the substrate wafer 300 and the device wafer 100 together without the use of an intermediate adhesive material that could have a different coefficient of thermal expansion than the single crystal silicon wafer. Fusion bonding can also be performed in which oxide layers are formed on the bonded surfaces of one or both of the wafers.

In step 603, after the opposing surfaces of the substrate wafer 300 and device layer 110 have been bonded, the handle layer 120 of the device wafer 100 can be removed using a wet etchant, such as KOH or TMAH, that stops on the insulator layer 115. Additionally, insulator layer 115 can be removed using wet or dry etching techniques, leaving only the bonded device layer 110, whose non-bonded top surface is now exposed. Additionally, in step 604 passivation layer 170 can be deposited on the non-bonded top surface of device layer 110 using, for example, silicon dioxide, silicon nitride layers, or combinations of both to properly insulate and protect the device wafer 110 during both the manufacturing process and operation.

With reference to step 605 of FIG. 12, one or more sensing elements 140 can be added by diffusion or ion implanting of, in one preferred embodiment using piezoresistive sensing elements, low doped p-type material into the doped n-type device layer 110 near the edges of diaphragm 130, which can be formed as part of the device layer 110. For example, Boron implantation and diffusion at high temperature may form piezoresistive sensing elements 140 within device layer 110. The sensing elements 140 can be positioned to sense flexure in diaphragm 130. It should be noted that any number of sensing elements 140 may be employed and their exact positioning relative to the diaphragm 130 may be different depending on the particular application, expected pressures, sensitivity requirements, and the like. Additionally, one or more interconnects 150 that can provide electrical conductivity to the sensing elements 140 can be added by diffusion or ion implanting of highly doped p-type material into the doped n-type device layer 110 overlapping to sensing elements 140.

Figure 13:
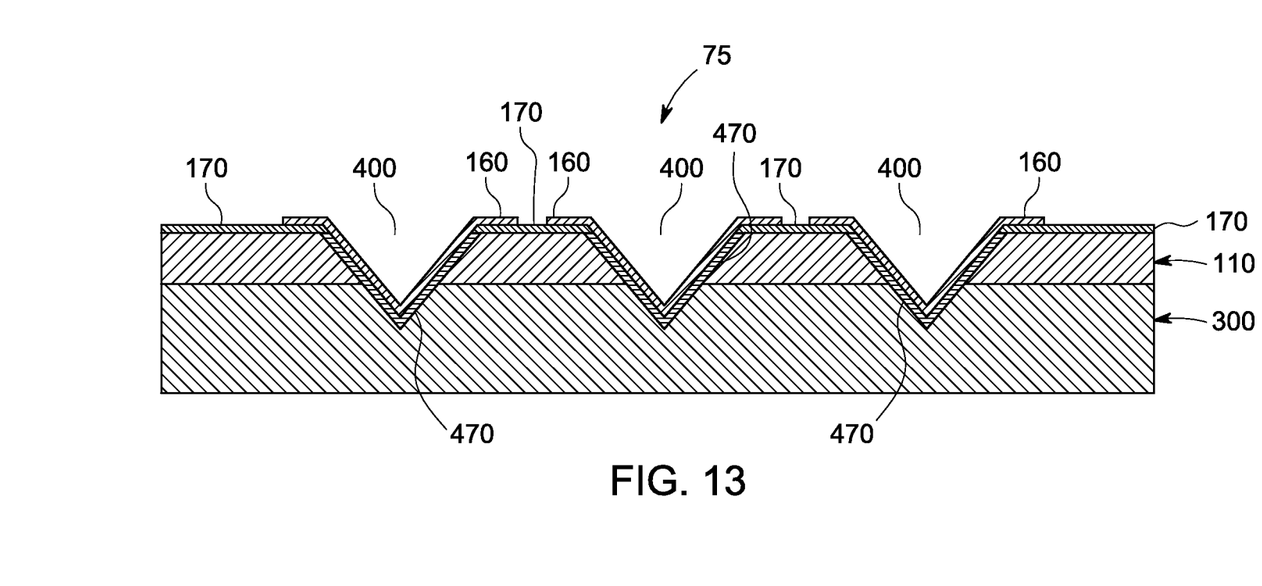
FIG. 13 is an exemplary cross sectional view of a proximal side of an absolute pressure sensor in one embodiment of the invention.

In step 606, one or more interconnect channels 400 that provide a passageway along the pressure sensor 10 for various conductors can be etched, in one embodiment, into device layers 110 and 210. First, as shown in FIG. 11, passivation layer 170 is etched using dry or wet etching techniques to define the location of the interconnect channels 400 on the proximal end of the pressure sensor opposite the end comprising the diaphragm. Once the passivation layer 170 has been removed, one or more interconnect channels 400 can be etched into device layer 110, and optionally device layer 210, through wet etching techniques, for example using KOH or TMAH. In one embodiment, interconnect channels 400 are etched to form a series of spaced apart v-shaped grooves, as shown in an exemplary cross section of the proximal end 75 of the pressure sensor 10 shown in FIG. 13. Interconnect channels 400 allow for the later connection of one or more conductors to the proximal end 75 of pressure sensor 10 while maintaining the small, elongated packaging required for some applications, such as catheter tip pressure sensors.

With reference again to FIGS. 11 and 12, in step 607 passivation layer 470 can be deposited on the surface of interconnect channels 400 using, for example, a silicon dioxide layer, a silicon nitride layer, or combinations of both to properly insulate and protect the interconnect channels 400 during both the manufacturing process and operation. Additionally, passivation layer 170 can be etched using dry or wet etching techniques to expose the interconnect 150. In step 608, metallization layer 160 can be added, providing electrical conductivity from the proximal end 75 of pressure sensor 10 to the sensing element 140 through interconnect 150. Metallization layer 160 can be formed of, for example, gold or aluminum, and can be created to a desired thickness to suit device design needs.

Substrate wafer 300 can be thinned using conventional etching techniques to accommodate given design specifications and thickness requirements for pressure sensor 10. In addition, in embodiments, in which substrate wafer 300 is an SOI wafer, the handle layer of the substrate wafer 300 can be removed using a wet etchant, such as KOH or TMAH, that stops on the insulator layer. Additionally, the insulator layer can be removed using wet or dry etching techniques, leaving only the device layer of the SOI wafer containing the vent 300 bonded to the device layer 110.

With reference to both differential and absolute pressure sensor embodiments described herein, each etche made during the fabrication of pressure sensor 10 can have any chosen geometry and can have any required depth depending on the particular application. Additionally, the etches need not have a single, uniform depth, and the resulting etches can be isotropic or anisotropic. The selected depth and geometry of each etch can be selected to alter the design characteristics of the resulting pressure sensor 10. For example, the thickness of device layer 110 and the size and shape of the diaphragm 130 dictated by diaphragm cavity 230 can be selected to determine the sensitivity of the resulting pressure sensor 10. The selected thickness of device layer 110, which can be arbitrarily chosen and precisely controlled in manufacturing the SOI wafer, leads to improved control over the flexibility of diaphragm 130, and therefore improved control over the performance characteristics of the resulting pressure sensor 10. Additionally, the planar manufacturing processes are ideal for manufacturing purposes and can increase not only the fabrication yield, but the overall reliability and long term performance of the resulting devices. Accordingly, uniform control over the performance characteristics of the pressure sensor 10 can be achieved.

The above detailed description is provided to illustrate exemplary embodiments and is not intended to be limiting. Although the method for fabricating a sensor has been shown and described with respect to embodiments which measure pressure, it will be apparent to those skilled in the art that similar techniques can be used to fabricate sensors capable of measuring other parameters. For example, it should be recognized that although various exemplary embodiments of the sensor and associated methods of manufacture disclosed herein have been described with reference to various catheter tip medical applications, the apparatus and method of manufacture are useful in a wide variety of other applications not explicitly described herein. It will also be apparent to those skilled in the art that numerous modifications and variations within the scope of the present invention are possible. Further, numerous other materials and processes can be used within the scope of the exemplary methods and structures described as will be recognized by those skilled in the art. For example, it should be recognized that the p-type and n-type materials described herein can be used in an alternative fashion, e.g., by replacing p-type materials for n-type materials and vice versa. Additionally, it will be apparent to those of skill in the art that the sequence of steps identified and described in various exemplary embodiments need not occur in the sequence described, and that in other embodiments various steps can be combined, performed in different orders, or in parallel and still achieve the same result.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for fabricating a sensor comprising the steps of:
    forming a diaphragm cavity that extends into the top surface of a substrate wafer, the top surface of the substrate wafer comprising silicon;
    bonding said silicon top surface of said substrate wafer directly to the bottom surface of as device wafer, the bottom surface of the device wafer comprising silicon, without an intermediate insulating layer forming a diaphragm over said diaphragm cavity, wherein said device wafer comprises a device layer whose silicon bottom surface forms the silicon bottom surface of the device wafer, a handle, and an insulator layer located between said device layer and said handle;
    removing said handle and said insulator layer from said device wafer;

placing a sensing element, in said device layer proximate said diaphragm to sense flexure in said diaphragm; and forming an interconnect channel by removing a portion of said device layer.

2. The method for fabricating a sensor of claim 1, wherein the step of forming an interconnect channel further comprises the step of removing a portion of said substrate wafer.

3. The method for fabricating a sensor of claim 1, further comprising the step of forming a metallization layer that fits at least partially within said interconnect channel.

4. The method for fabricating as sensor of claim 1, wherein said sensing element is a piezoresistive sensing element.

5. The method for fabricating a sensor of claim 1, wherein said substrate wafer comprises a double side polished semiconductor wafer.

6. The method for fabricating a sensor of claim wherein said substrate wafer comprises a device layer, an insulator layer, and a handle, wherein said insulator layer is located between said device layer and said handle.

7. The method for fabricating a sensor of claim 6, further comprising the step of removing said handle and said insulator layer from said substrate wafer.

8. The method for fabricating a sensor of claim 1, wherein said sensor measures absolute pressure.

9. The method for fabricating, a sensor of claim wherein the thickness of said device layer determines the sensitivity of said sensor.

10. The method for fabricating a sensor of claim 1, wherein the step of forming a diaphragm cavity that extends into the top surface of a substrate wafer comprises forming a V-shaped diaphragm cavity haying tapered sidewalls that join together in the substrate wafer.

* * * * *

UNITED STATES PATENT AND TRADEMARK OFFICE
CERTIFICATE OF CORRECTION

PATENT NO. : 8,435,821 B2  
APPLICATION NO. : 12/818611  
DATED : May 7, 2013  
INVENTOR(S) : Gamage et al.

Page 1 of 1

It is certified that error appears in the above-identified patent and that said Letters Patent is hereby corrected as shown below:

In the Drawings

In Fig. 11, Sheet 7 of 9, delete "  " and insert --  --, therefor.

In the Specification

In Column 4, Line 50, delete "vent 330," and insert -- vent cavity 330, --, therefor.

In Column 5, Lines 48-49, delete "substrate wafer 330." and insert -- substrate wafer 300. --, therefor.

In Column 5, Line 60, delete "substrate wafer 330" and insert -- substrate wafer 300 --, therefor.

In the Claims

In Column 10, Line 58, in Claim 1, delete "as device" and insert -- a device --, therefor.

In Column 11, Line 1, in Claim 1, delete "element," and insert -- element --, therefor.

In Column 11, Line 11, in Claim 4, delete "as sensor" and insert -- a sensor --, therefor.

In Column 11, Line 16, in Claim 6, delete "claim" and insert -- claim 1, --, therefor.

In Column 11, Line 25, in Claim 9, delete "fabricating, a sensor of claim" and insert -- fabricating a sensor of claim 1, --, therefor.

In Column 11, Line 31, in Claim 10, delete "haying" and insert -- having --, therefor.

Signed and Sealed this  
Twentieth Day of August, 2013

Teresa Stanek Rea  
*Acting Director of the United States Patent and Trademark Office*